(12) United States Patent
Yu et al.

(10) Patent No.: US 8,044,687 B2
(45) Date of Patent: Oct. 25, 2011

(54) WIDE INPUT COMMON MODE VOLTAGE COMPARATOR

(75) Inventors: Ta Lee Yu, Shanghai (CN); Qian Yu Yu, Shanghai (CN)

(73) Assignee: Semiconductor Manufacturing International (Shanghai) Corporation

( * ) Notice: Subject to any disclaimer, the term of this patent is extended or adjusted under 35 U.S.C. 154(b) by 93 days.

(21) Appl. No.: 11/548,696

(22) Filed: Oct. 11, 2006

(65) Prior Publication Data

US 2008/0018362 A1   Jan. 24, 2008

(30) Foreign Application Priority Data

Apr. 30, 2006   (CN) .......................... 2006 1 0026321

(51) Int. Cl.
*H03K 5/22*   (2006.01)
(52) U.S. Cl. .......................................... 327/65; 327/50
(58) Field of Classification Search .................. 327/50, 327/58, 62–66
See application file for complete search history.

(56) References Cited

U.S. PATENT DOCUMENTS

| 6,069,533 | A  | * | 5/2000 | Kim .............................. 330/258 |
| 6,172,535 | B1 | * | 1/2001 | Hopkins ......................... 327/66 |
| 6,316,871 | B2 | * | 11/2001 | Park .............................. 313/412 |
| 6,445,218 | B1 | * | 9/2002 | Lee ................................ 327/65 |
| 6,559,687 | B1 | * | 5/2003 | Hunt .............................. 327/65 |
| 7,221,190 | B2 | * | 5/2007 | Partow et al. .................. 327/65 |
| 7,505,580 | B2 | * | 3/2009 | Fallahi et al. ................. 379/398 |
| 7,573,302 | B2 | * | 8/2009 | Nakamura ..................... 327/89 |

* cited by examiner

*Primary Examiner* — Dinh T. Le
(74) *Attorney, Agent, or Firm* — Kilpatrick Townsend and Stockton LLP

(57) ABSTRACT

A design for a wide input common mode voltage comparator is provided which reduces the delay between outputs from component comparators. The wide input common mode voltage comparator includes a first comparator configured to receive a differential input. The first comparator is further configured to accommodate high common mode voltages. The wide input common mode voltage comparator further includes a second comparator configured to receive the differential input. The first comparator is further configured to accommodate low common mode voltages. Additionally, the threshold voltages of the active devices within the comparator are between −100 to 100 mV. Furthermore, the wide input common mode voltage comparator includes a summing circuit configured to receive the outputs of the first and second comparators to create a single-ended output.

11 Claims, 9 Drawing Sheets

WIDE INPUT COMMON MODE VOLTAGE COMPARATOR

CROSS-REFERENCES TO RELATED APPLICATIONS

This patent application claims priority to Chinese Patent Application Serial No. 200610026321.4, filed Apr. 30, 2006, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to integrated circuits. More particularly, the invention provides a device and method for comparing voltages. Merely by way of example, the invention has been applied to an wide input common mode voltage comparator. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is the performance of a voltage comparator. For example, voltage comparators can be integrated within a variety of integrated circuits. Wide-input common mode voltage comparators often utilize two comparators, an NMOS comparator to accommodate high common mode voltages and a PMOS comparator to accommodate low common mode voltages. The outputs of the two comparators are combined together within a summing circuit to create a single-ended output. However a delay may occur between the outputs of the comparators as a result of the type of circuits used in the NMOS and PMOS comparators.

From the above, it is seen that an improved design for a wide-input common mode voltage comparator is desired.

BRIEF SUMMARY OF THE INVENTION

The present invention is directed to integrated circuits. More particularly, the invention provides a device and method for comparing voltages. Merely by way of example, the invention has been applied to an wide input common mode voltage comparator. But it would be recognized that the invention has a much broader range of applicability.

In a specific embodiment of the present invention, a wide input common mode voltage comparator is provided. The wide input common mode voltage comparator includes a first comparator configured to receive a differential input. The first comparator is further configured to accommodate high common mode voltages. The wide input common mode voltage comparator further includes a second comparator configured to receive the differential input. The first comparator is further configured to accommodate low common mode voltages. Additionally, the threshold voltages of the active devices within the comparator are between −100 to 100 mV. Furthermore, the wide input common mode voltage comparator includes a summing circuit configured to receive the outputs of the first and second comparators to create a single-ended output.

In another specific embodiment of the present invention, a low common mode voltage comparator is provided. The low common mode voltage comparator includes a current sink coupled to ground. The low common mode voltage comparator additionally includes first and second input transistors with a threshold voltage between −100 to 100 mV. The first and second input transistors are coupled to the current sink. Furthermore, the low common mode voltage comparator includes first and second outputs, the first and second outputs coupled to the input transistors. In addition, the low common mode voltage comparator includes a load circuit coupled to the first and second outputs and additionally coupled to a voltage source.

In yet another specific embodiment of the present invention, a low common mode voltage comparator is provided. The low common mode voltage comparator includes a first native NMOS transistor coupled to ground at its source terminal. The low common mode voltage comparator additionally includes second and third native NMOS transistors. The second and third native NMOS transistors are coupled to the drain terminal of the first native NMOS transistor and receive an input differential voltage as gate voltages. The low common mode voltage comparator also includes a first PMOS transistor coupled at its drain terminal to the drain terminal of the second native NMOS transistor. The drain terminal of the first PMOS transistor is additionally coupled to the gate terminal of the first PMOS transistor. Furthermore, the low common mode voltage comparator includes a second PMOS transistor coupled at its drain terminal to the drain terminal of the third native NMOS transistor. The drain terminal of the second PMOS transistor is additionally coupled to the gate terminal of the second PMOS transistor. Also, the low common mode voltage comparator includes a third PMOS transistor coupled at its gate terminal to the gate terminal of the first PMOS transistor. The drain terminal of the third PMOS transistor is coupled to a first output. In addition, the low common mode voltage comparator includes a fourth PMOS transistor coupled at its gate terminal to the gate terminal of the second PMOS transistor. The drain terminal of the fourth PMOS transistor is coupled to a first output. The first, second, third, and fourth PMOS transistors are coupled to a voltage source at their source terminals.

Many benefits are achieved by way of the present invention over conventional techniques. For example, the present technique provides an easy to use process that relies upon conventional technology. In some embodiments, a wide-input common mode voltage comparator is provided which greatly reduces the delay between the two component comparators.

By reducing the delay between the comparators, greater accuracy and precision can be achieved within the voltage comparator. This additionally can result in reduced amounts of skew and reduced tolerances for the circuit. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a device and method for comparing voltages. Merely by way of example, the invention has been applied to an wide input common mode voltage comparator. But it would be recognized that the invention has a much broader range of applicability.

Figure 1:
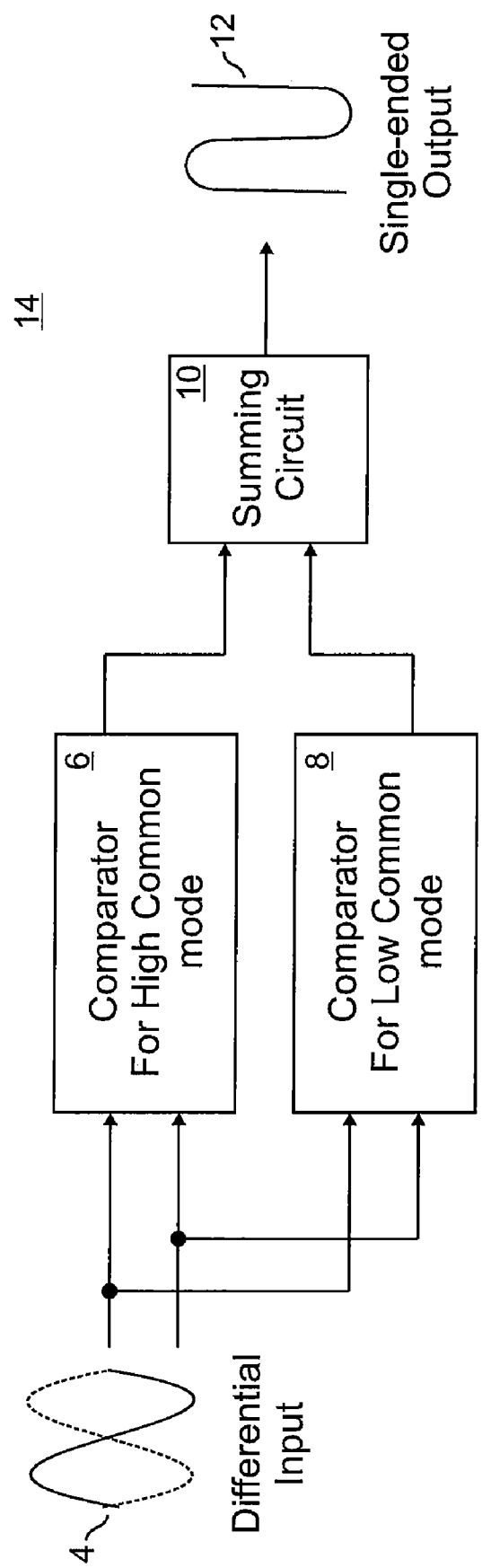
FIG. 1 is a simplified conventional implementation of a wide input common mode voltage comparator.

FIG. 1 is a simplified conventional implementation of a wide input common mode voltage comparator. Differential inputs 4 are input into a wide input common mode comparator 14 as a differential signal. Comparator 14 may be used as a front comparator used in series with other amplifiers to amplify the signal. For example, the inputs may be transmitted using a common mode voltage that is common to both input terminals. Differential inputs 4 are input into both component comparators 6 and 8, which handle different levels of common mode voltage. For example, comparator 6 is designed to accommodate high levels of common mode voltage, which may be from 1.5-3V. Comparator 8 is designed to accommodate low common mode voltages, which may be from 0.05-2V. For example, comparator 6 may be implemented using NMOS circuits as active devices and comparator 8 may be implemented using PMOS circuits as active devices, as will be shown in FIGS. 3A and 3B. There may be a slight overlap between the ranges of the two comparators. The outputs of two comparators 6 and 8 are summed together in summing circuit 10 to create a single-ended output 12.

Figure 2:
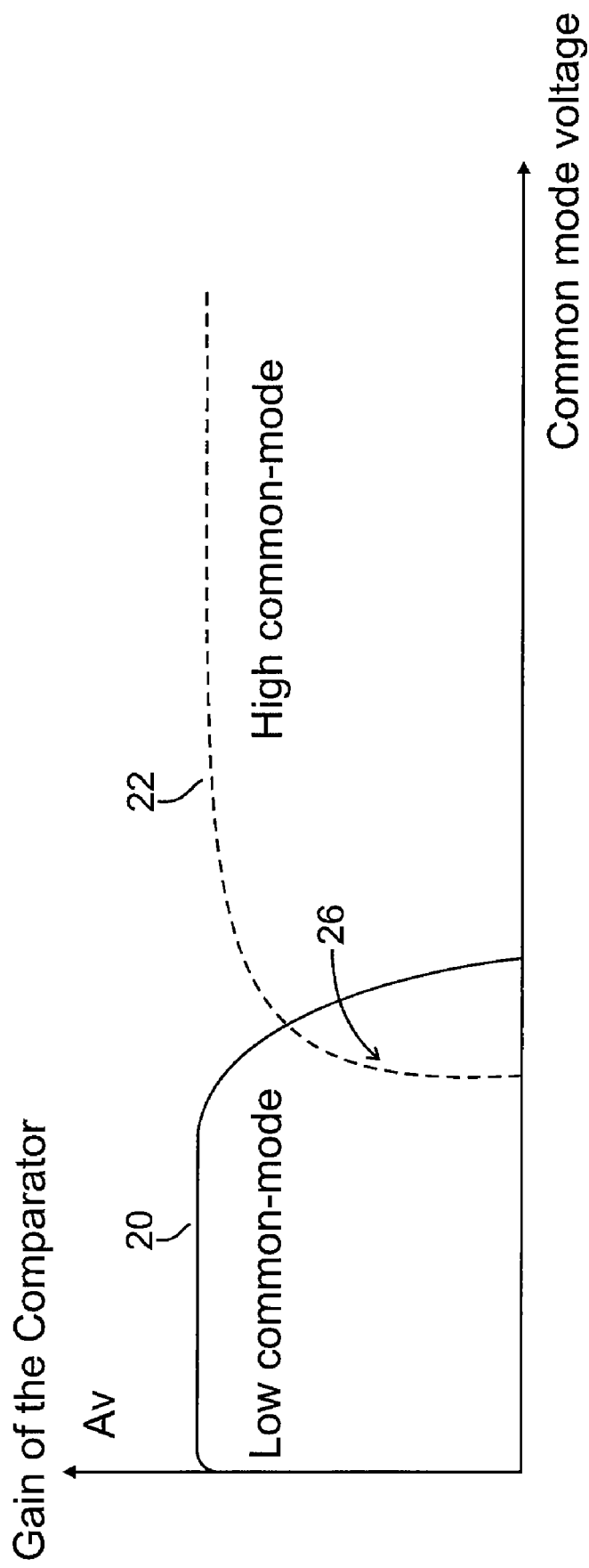
FIG. 2 is a diagram showing the gain vs. common mode voltage for a conventional implementation of a wide input common mode voltage comparator.

Two component comparators may be needed within wide-input common mode comparator 14 to accommodate for different common mode voltages. FIG. 2 is a diagram showing the gain vs. common mode voltage for a conventional implementation of a wide input common mode voltage comparator. The gains of the comparator are shown for different common mode voltages. For example, low common mode comparator displays a large gain 20 for low common mode voltages, that gradually decreases and goes to zero as the common mode increases. The high common mode comparator displays a high gain 22 for high common mode voltages, which gradually reduces as the common mode voltages is decreased. For high common mode voltage inputs, the majority of the gain is through the high common mode comparator, while for low common mode voltages, the majority of the gain is through the low common mode comparator. As mentioned previously, there may be a degree of overlap for ranges 26 common to both of the two component comparators where both comparators are used. The two kinds of comparators (high common mode and low common mode) exhibit different performance characteristics under different input common mode voltages.

Figures 3A, 3B:
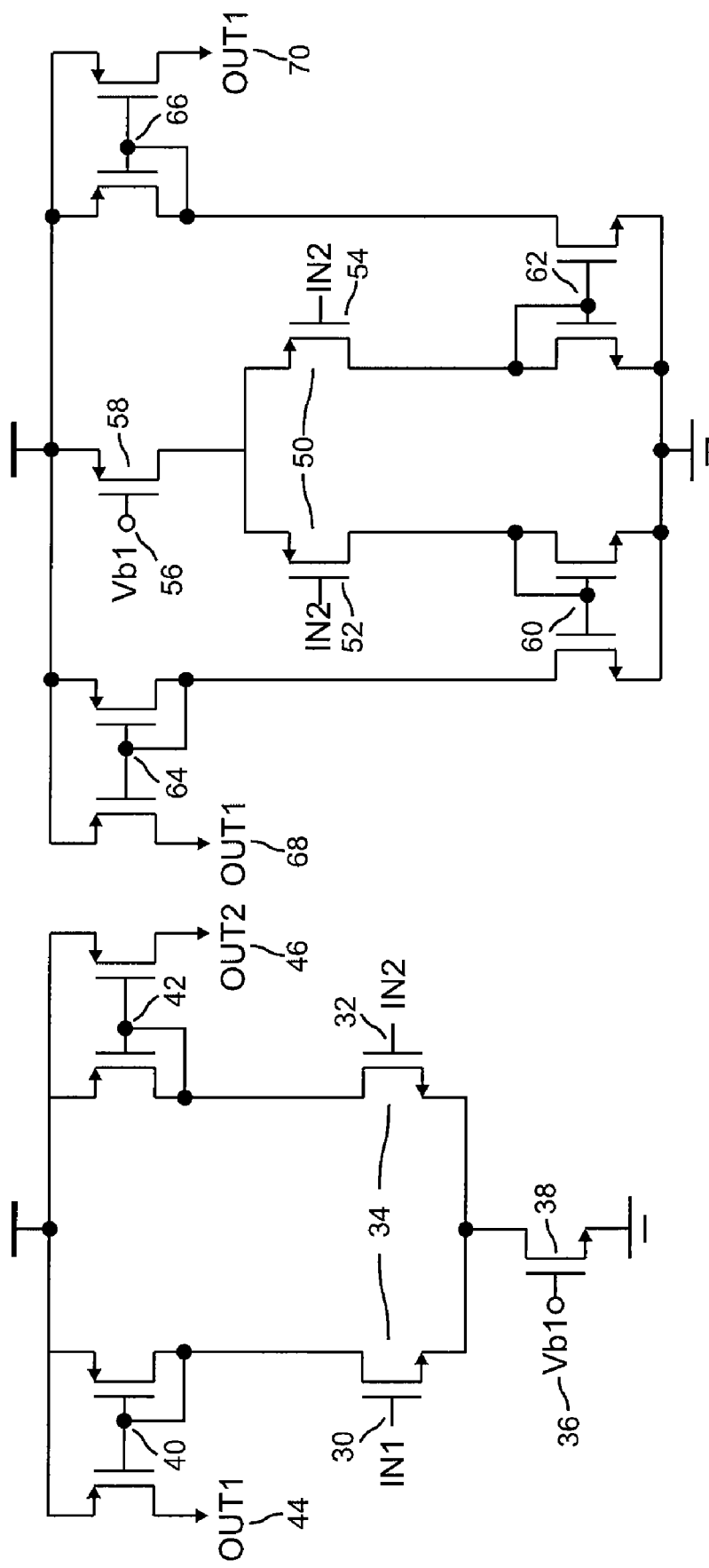
FIGS. 3A and 3B are conventional drawings showing a circuit implementation of component comparators used within a wide input common mode voltage comparator.

FIGS. 3A and 3B are conventional drawings showing a circuit implementation of component comparators used within a wide input common mode voltage comparator. For example, FIG. 3A is an example of a circuit implementation that can be used for a high common mode comparator while FIG. 3B is an example of a circuit implementation that can be used for a low common mode comparator. In FIG. 3A, differential inputs IN1 (30) and IN2 (32) are used as gate voltages for active NMOS circuits 34. Voltage Vb1 (36) is used as a bias voltage for NMOS circuit 38, which is coupled to ground. When NMOS circuits 34 are coupled through NMOS circuit 38 using Vb1 (36), NMOS circuit 38 functions as a current sink. Two PMOS circuits 40 and 42 are used as the load before outputs OUT1 (44) and OUT2 (46). Two outputs may be used as the input voltages may be very low and require amplification at a later stage. For example, the input voltages may be between 100 mV and 400 mV. The current direction within the circuit shown in FIG. 3A is downwards, from the voltage source to ground.

In FIG. 3B, differential inputs IN1 (52) and IN2 (54) are used as gate voltages for active PMOS devices 50. Vb2 (56) is used as a gate voltage for PMOS circuit 58, which functions as a P-type current source when coupled. As a result, the current direction of the FIG. 3B is opposite that of FIG. 3A in that PMOS circuit 58 is functioning as a current source, not a current sink. Two NMOS circuits 60 and 62 are used as the load before outputs OUT1 and OUT2. In addition, a pair of inverter stages or replica circuits 64 and 66 are required to invert the signal and change the current direction before output due to the different directions of current flowing in the two component comparators.

Figure 4:
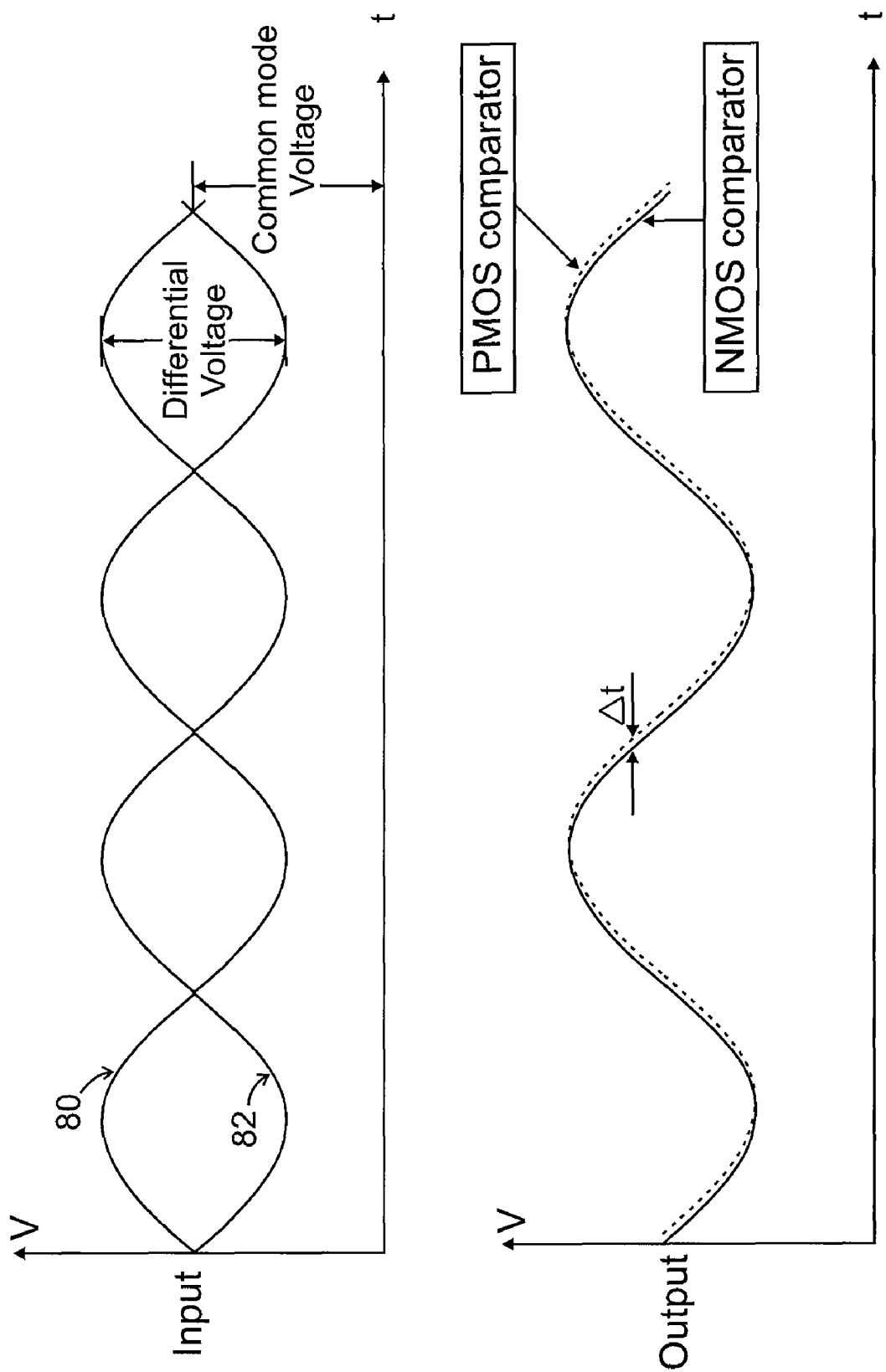
FIG. 4 is an exemplary diagram showing the input and output values of a wide input common mode voltage comparator.

FIG. 4 is an exemplary diagram showing the input and output values of a wide input common mode voltage comparator. The input to the wide input common mode voltage comparator is shown as two component signals 80 and 82. The common mode voltage can be seen as the shared voltage between the two input terminals, while the differential voltage is the difference between the two component signals 80 and 82. However, the output of the two high common mode comparator and the low common mode comparators may lag each other by an amount Δt as a result of the different circuits used within the comparator. The amount Δt may have an increased effect upon the summing output when the frequency is higher. This delay can result in incorrect or delayed values being returned by the wide input common mode voltage comparator. New circuit designs may be needed for the high and low common mode comparators to reduce or eliminate this delay.

Figure 5:
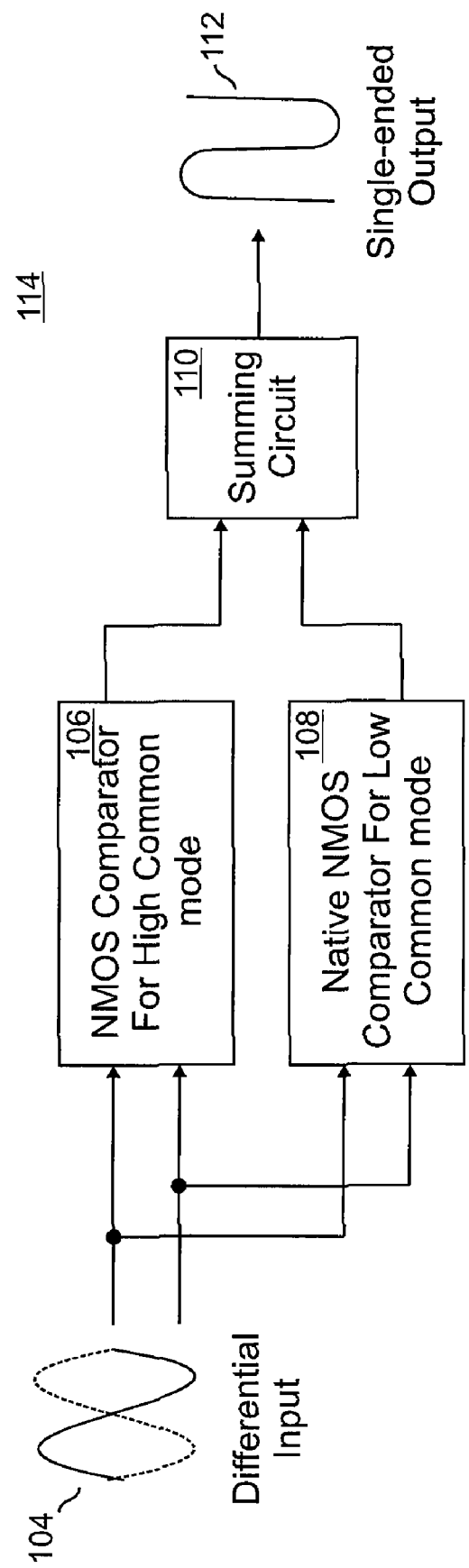
FIG. 5 is a simplified exemplary implementation of a wide input common mode voltage comparator according to an embodiment of the present invention.

FIG. 5 is a simplified exemplary implementation of a wide input common mode voltage comparator according to an embodiment of the present invention. Similar to FIG. 1, a differential input 104 is provided to a wide-input common mode comparator 114 as a differential signal. Differential inputs 104 are input into both component comparators 106 and 108, which handle different levels of common mode voltage. For example, comparator 106 is designed to accommodate high levels of common mode voltage, which may be from 1.5-3V. Comparator 108 is designed to accommodate low common mode voltages, which may be from 0.05-2V. There may be a slight overlap between the ranges of the two comparators. The outputs of two comparators 106 and 108 are summed together in summing circuit 10 to create a single-ended output 112. Comparator 106 may be implemented as an NMOS comparator, similar to that shown in FIG. 3A. However, comparator 108 is implemented using active devices that have a reduced threshold voltage. The reduced threshold voltage of the active devices allows them to comparator to function for a range of low common mode voltages. For example, the threshold voltage of the native NMOS devices used within comparator 108 may range from −100 mV to 100 mV. In comparison, the threshold voltage of conventional NMOS transistors used as the active devices ranges from 0.4-0.6V. Of course, there can be other variations, modifications, and alternatives.

Figures 6A, 6B:
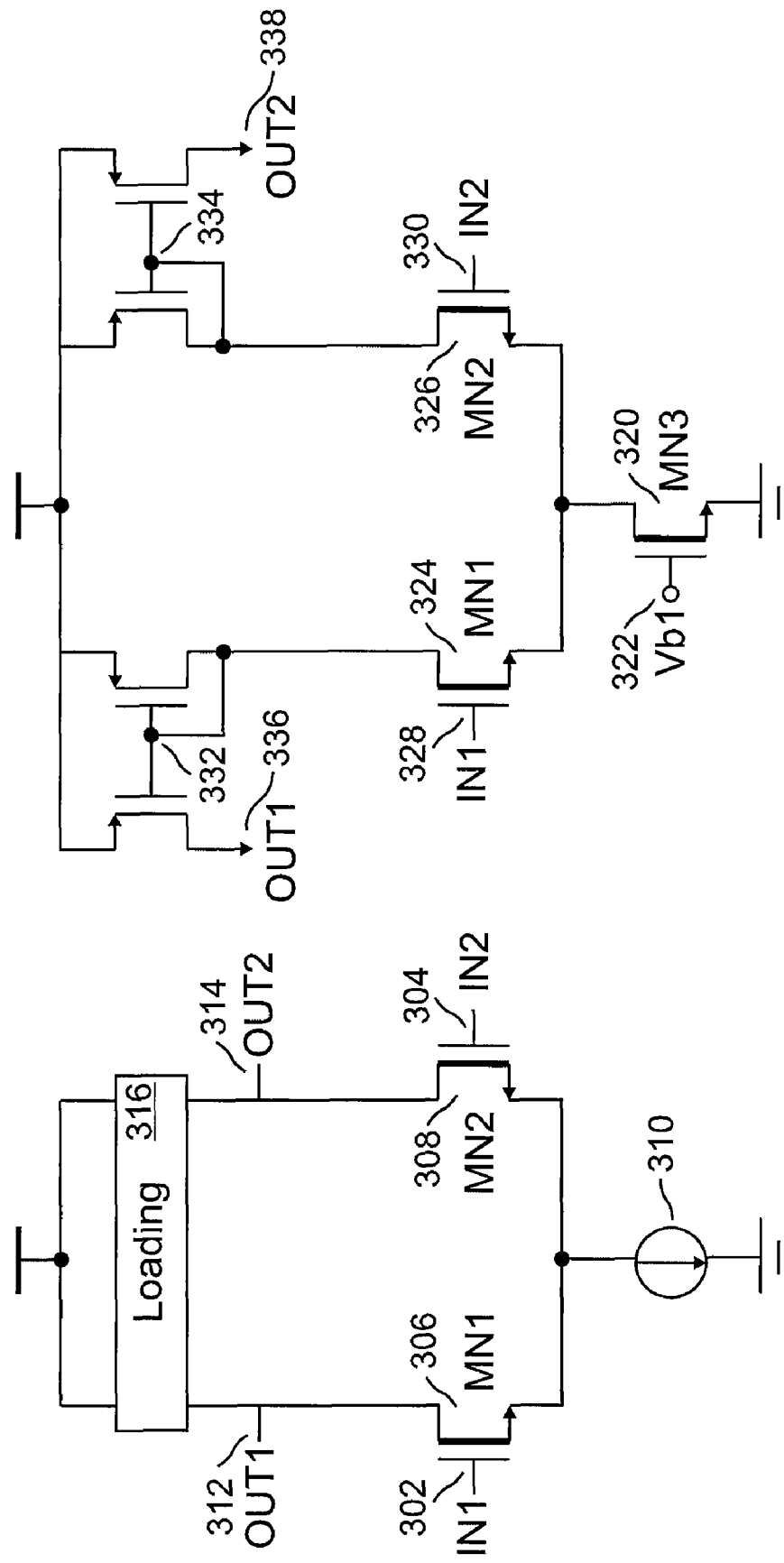
FIGS. 6A and 6B are simplified exemplary drawings showing a circuit implementation of component comparators used within a wide input common mode voltage comparator according to an embodiment of the present invention.

FIGS. 6A and 6B are simplified exemplary drawings showing a circuit implementation of component comparators used within a wide input common mode voltage comparator according to an embodiment of the present invention. For example, the drawing shows an exemplary schematic of a comparator utilizing native devices which can be used when the input common mode voltage is low. These diagrams are merely an example, which should not unduly limit the scope of the claims. One of ordinary skill in the art would recognize many variations, alternatives, and modifications. FIGS. 6A and 6B represent simplified drawings that offer varying levels of detail and abstraction for the same circuit.

Differential inputs IN1 (302) and IN2 (304) are used as gate voltages for native NMOS circuits MN1 (306) and MN2 (308), which are used as active devices. The reduced threshold voltage of the native NMOS devices in comparison to PMOS devices allows for them to be turned on with lower voltages. For example, the threshold voltage $V_t$ may be between −100 to 100 mV, and the gate-source bias voltage $V_{gs}$ required for turn on may be equal to zero, allowing for near-immediate turn-on of the native NMOS devices. The inclusion of NMOS devices instead of native NMOS devices would not work because the higher threshold voltage of the NMOS devices would result in the circuit not working under low common mode voltages. Additionally the formation of native NMOS devices is compatible with normal CMOS logic processes and does not require additional lithography masks during the formation of the device.

Current sink 310 is coupled on one end to the source terminal of native NMOS devices MN1 (306) and MN2 (308) and on the other end to ground. The current direction within the circuit is downwards, from the voltage source to ground, in contrast to the current direction of the low common mode voltage comparator shown in FIG. 3B. The drain terminals of native NMOS devices MN1 (306) and MN2 (308) are connected to output points OUT1 (312) and OUT2 (314) and load block 316 which functions as a load for the circuit. Of course, there can be other variations, modifications, and alternatives.

In FIG. 6B, current source 310 is implemented as native NMOS device 320, with bias voltage Vb1 (322) used as the gate voltage. Native NMOS active devices MN1 (324) and MN2 (326) receive input voltages IN1 (328) and IN2 (330) as gate voltages in a similar manner as in FIG. 6A. For example, the source terminals of native NMOS active devices MN1 (324) and MN2 (326) may be coupled to the drain terminal of native NMOS device 320. Load block 310 is implemented as using two PMOS devices 332 and 334, which are used as replica circuits. Outputs OUT1 (336) and OUT2 (338) are coupled to the load devices 332 and 334. Of course, there can be other variations, modifications, and alternatives.

Figure 7:
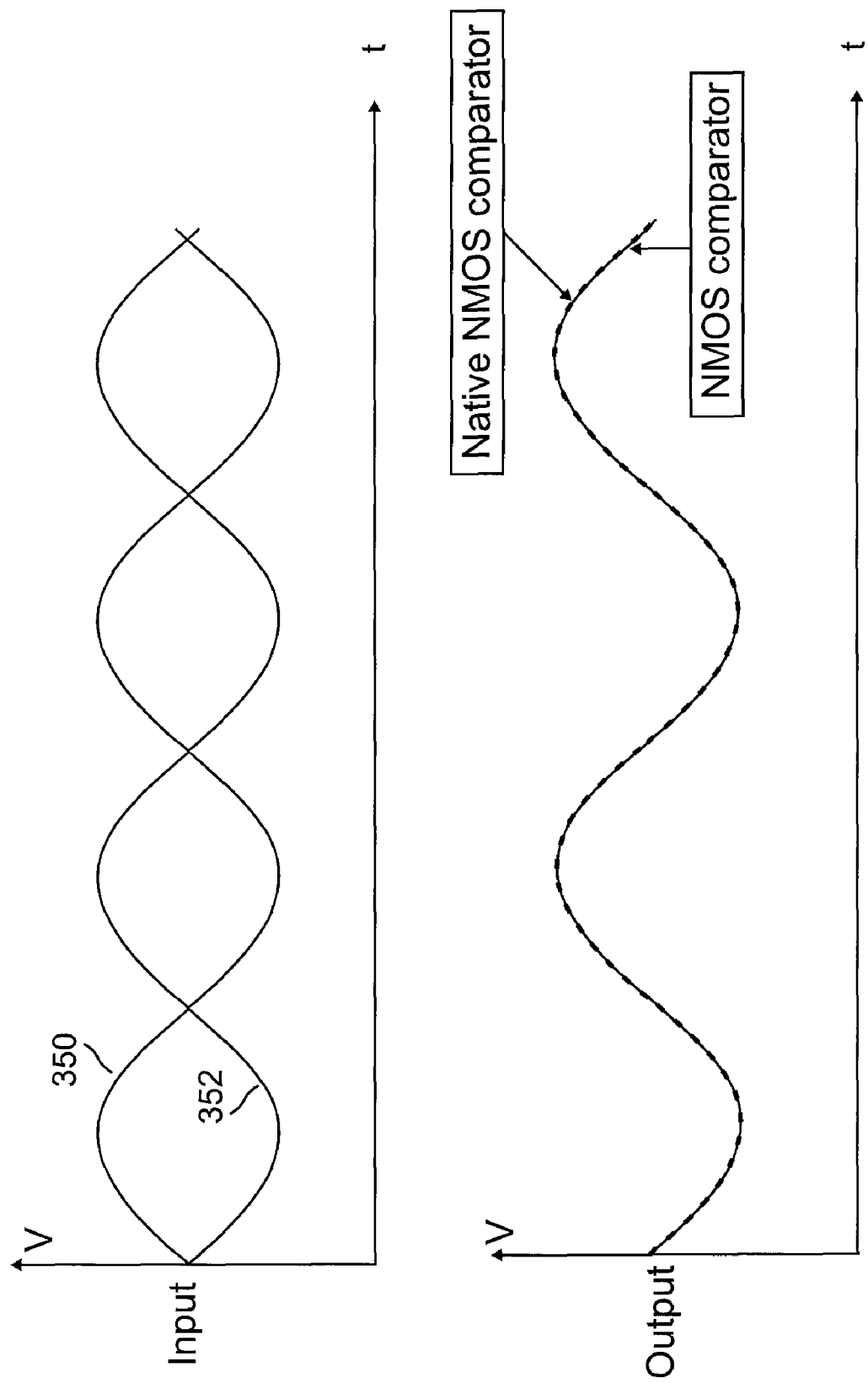
FIG. 7 is an exemplary diagram showing the input and output values of a wide input common mode voltage comparator according to an embodiment of the present invention.

FIG. 7 is an exemplary diagram showing the input and output values of a wide input common mode voltage comparator according to an embodiment of the present invention. This diagram is merely an example, which should not unduly limit the scope of the claims. One of ordinary skill in the art would recognize many variations, alternatives, and modifications. Differential inputs 350 and 352 are input into the wide input common mode comparator. As the current direction of the native NMOS comparator used for low common mode voltages is the same as that of the NMOS comparator used for high common mode voltages, the amount of delay Δt can be greatly reduced due an inverter no longer being needed within the native NMOS comparator to reduce the current direction. Of course, there can be other variations, modifications, and alternatives.

Figure 8:
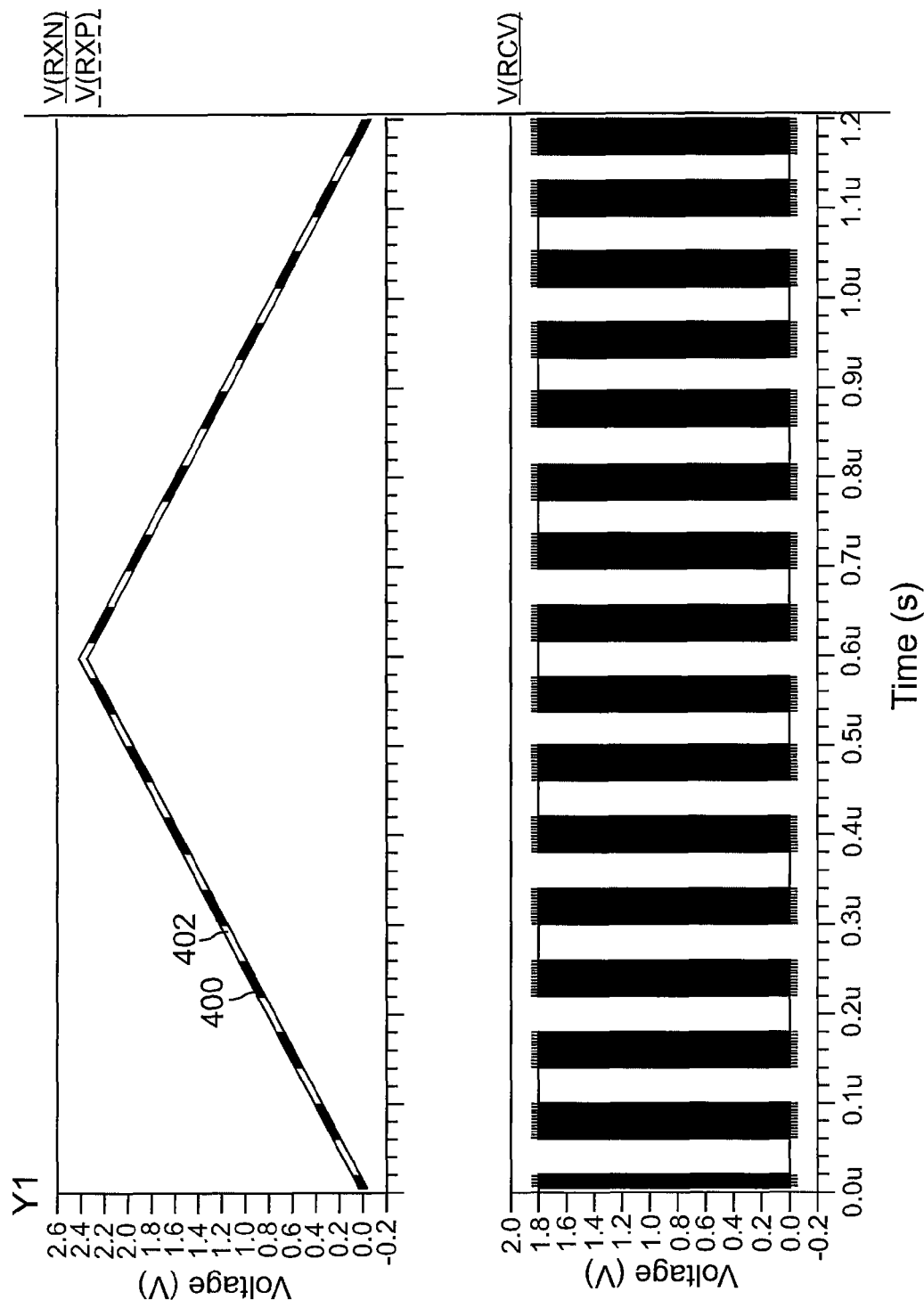
FIGS. 8 and 9 shows exemplary results of simulation testing showing comparator input common voltage during a voltage sweep and the output according to an embodiment of the present invention.
Figure 9:
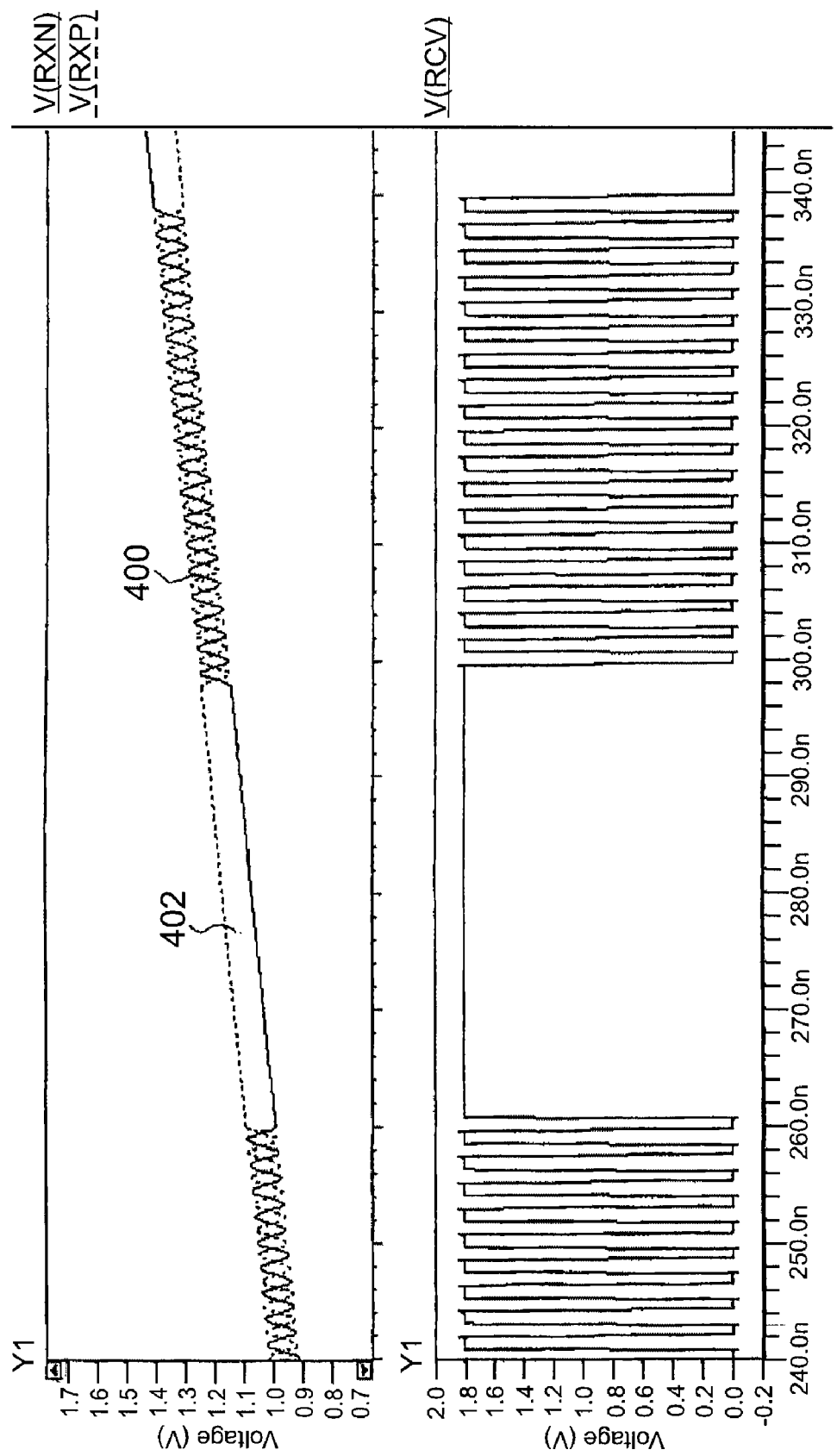

FIGS. 8 and 9 shows exemplary results of simulation testing showing comparator input common voltage during a voltage sweep and the output according to an embodiment of the present invention. Voltages are input into an exemplary simulated comparator to for testing. During an oscillating section 400, the differential voltages oscillate between a pair of values, while during a stable section 402 the differential voltages are maintained at the same value, which is gradually shifted by a varying common voltage. A close up of sections 400 and 402 can be seen in FIG. 9. The output shown on the bottom graphs of FIGS. 8 and 9 do not display a delay in the output. FIG. 8 shows a input signal to the comparator, where the differential voltage is always stable, but the common mode voltage is swept from a range of values between 0~2.4V. The lower part of FIG. 8 shows the single-ended output voltage of the comparator. FIG. 9 show a close up of exemplary signal section 400. It can be seen that the exemplary comparator is capable of receiving the input voltage at a fast rate and without data loss. In addition, the enhanced stability of the comparator can be seen for a variety of common mode voltage inputs.

It is to be understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A wide input common mode voltage comparator comprising:
 a high common mode voltage comparator comprising:
  a bias NMOS transistor having a first source terminal coupled to ground;
  a pair of differential NMOS transistors coupled to a first drain terminal of the bias NMOS transistor; and
  a first load block coupled to the bias pair of differential NMOS transistor;

a summing circuit;
a low common mode voltage comparator comprising:
  a first native NMOS transistor serving as a bias transistor and being coupled to ground at its source terminal;
  second and third native NMOS transistors forming a differential pair, the second and third native NMOS transistors coupled to the drain terminal of the first native NMOS transistor and receiving an input differential voltage as gate voltages, the second and the third NMOS transistors having a threshold voltage between −100 to 100 mV; and
  a second load block comprising:
    a first PMOS transistor coupled at its drain terminal to the drain terminal of the second native NMOS transistor; the drain terminal of the first PMOS transistor additionally coupled to the gate terminal of the first PMOS transistor;
    a second PMOS transistor coupled at its drain terminal to the drain terminal of the third native NMOS transistor; the drain terminal of the second PMOS transistor additionally coupled to the gate terminal of the second PMOS transistor;
    a third PMOS transistor coupled at its gate terminal to the gate terminal of the first PMOS transistor, the drain terminal of the third PMOS transistor coupled to a first output; and
    a fourth PMOS transistor coupled at its gate terminal to the gate terminal of the second PMOS transistor, the drain terminal of the fourth PMOS transistor coupled to a first output;
wherein:
the first, second, third, and fourth PMOS transistors are coupled to a voltage source at their source terminals;
the high common voltage comparator receives the input differential and generates a second output;
the summing circuit receives the first output and the second output and generates a third output based on the first output and the second output.

2. The wide input common mode voltage comparator of claim 1 wherein the threshold voltage of the first native NMOS devices is between −100 to 100 mV.

3. The wide input common mode voltage comparator of claim 1 wherein the low common mode voltage comparator is configured to handle voltages between 0.05-2V.

4. A wide input common mode voltage comparator comprising:
  a high common mode voltage comparator;
  a summing circuit; and
  a low common mode voltage comparator comprising:
    a current sink coupled to ground;
    first and second input transistors having a threshold voltage between −100 to 100 mV, the first and second input transistors being directly coupled to the current sink;
    first and second outputs, the first and second outputs coupled to the input transistors, and
    a load circuit, the load circuit coupled to the first and second outputs and additionally coupled to a voltage source;
wherein:
the high common mode voltage comparator generates a third output;
the summing circuit is configured to process the first and third outputs and generates a fourth output.

5. The wide input common mode voltage comparator of claim 4 wherein the first and second input transistors are NMOS transistors.

6. The wide input common mode voltage comparator of claim 5 wherein the first and second input transistors are native NMOS transistors.

7. The wide input common mode voltage comparator of claim 4 wherein the current sink is implemented using a native NMOS transistor.

8. The wide input common mode voltage comparator of claim 7 wherein the native MNOS transistor functioning as the current sink is coupled to ground at its source terminal and coupled to the source terminals of the first and second input transistors at its drain terminal.

9. The wide input common mode voltage comparator of claim 4 wherein the load circuit is implemented using PMOS transistors.

10. The wide input common mode voltage comparator of claim 4 wherein the low common mode voltage comparator is configured to handle voltages between 0.05-2V.

11. A wide input common mode voltage comparator comprising:
  a high common mode voltage comparator;
  a summing circuit; and
  a low common mode voltage comparator comprising:
    a first native NMOS transistor coupled to ground at its source terminal;
    second and third native NMOS transistors, the second and third native NMOS transistors directly coupled to the drain terminal of the first native NMOS transistor, a gate terminal of the second NMOS transistor being directly coupled to a first differential input voltage, a gate terminal of the third NMOS transistor being directly coupled to a second differential input voltage, the second and the third NMOS transistors having a threshold voltage between −100 to 100 mV;
    a first PMOS transistor coupled at its drain terminal to the drain terminal of the second native NMOS transistor; the drain terminal of the first PMOS transistor additionally coupled to the gate terminal of the first PMOS transistor;
    a second PMOS transistor coupled at its drain terminal to the drain terminal of the third native NMOS transistor; the drain terminal of the second PMOS transistor additionally coupled to the gate terminal of the second PMOS transistor;
    a third PMOS transistor coupled at its gate terminal to the gate terminal of the first PMOS transistor, the drain terminal of the third PMOS transistor coupled to a first output; and
    a fourth PMOS transistor coupled at its gate terminal to the gate terminal of the second PMOS transistor, the drain terminal of the fourth PMOS transistor coupled to a first output;
wherein:
the first, second, third, and fourth PMOS transistors are coupled to a voltage source at their source terminals;
the high common voltage comparator receives the input differential and generates a second output;
the summing circuit receives the first output and the second output and generates a third output based on the first output and the second output.

* * * * *